United States Patent
Yanagisawa et al.

[11] Patent Number: 5,874,750
[45] Date of Patent: Feb. 23, 1999

[54] PRESSURE-CONTACT TYPE SEMICONDUCTOR DEVICE

[75] Inventors: Satoshi Yanagisawa, Tokyo; Michiaki Hiyoshi, Kanagawa-ken, both of Japan

[73] Assignee: Kabushiki Kaisha Toshiba, Kawasaki, Japan

[21] Appl. No.: 743,812

[22] Filed: Nov. 6, 1996

[30] Foreign Application Priority Data

Nov. 8, 1995 [JP] Japan .................................. 7-289880

[51] Int. Cl.⁶ ......................... H01L 29/74; H01L 31/111
[52] U.S. Cl. ......................... 257/133; 257/139; 257/785
[58] Field of Search .................................. 257/133, 785, 257/164, 262, 713, 365, 360, 139

[56] References Cited

U.S. PATENT DOCUMENTS

| | | | |
|---|---|---|---|
| 4,965,710 | 10/1990 | Pelly et al. | 257/713 |
| 5,245,202 | 9/1993 | Yasukazu | 257/133 |
| 5,337,214 | 8/1994 | Lindsey et al. | 257/713 |
| 5,530,277 | 6/1996 | Otsuki et al. | 257/360 |
| 5,596,466 | 1/1997 | Ochi . | |
| 5,641,976 | 6/1997 | Taguchi | 257/785 |

*Primary Examiner*—Sara W. Crane
*Assistant Examiner*—Phat X. Cao
*Attorney, Agent, or Firm*—Finnegan, Henderson, Farabow, Garrett & Dunner, L.L.P.

[57] ABSTRACT

A pressure-contact type semiconductor device such as an insulated gate bipolar transistor. The device includes semiconductor chip, a gate electrode on a first surface of the semiconductor chip, an emitter electrode insulated and separated from the gate electrode, and an emitter sensing electrode on the first surface of the semiconductor chip. A collector layer is on the second surface of the semiconductor chip. The emitter sensing electrode monitors the emitter voltage. Because the emitter sensing electrode is on the semiconductor chip, the emitter sensing electrode is not influenced by inductance between an emitter and an emitter terminal.

16 Claims, 6 Drawing Sheets

PRESSURE-CONTACT TYPE SEMICONDUCTOR DEVICE

BACKGROUND OF THE INVENTION

1. Field of the Invention

The present invention relates to a pressure-contact type semiconductor device and more particularly to an emitter voltage sensing electrode in MOS gate driving switching devices used in, for instance, IGBT (Insulated Gate Bipolar Transistor), thyristor, etc.

2. Description of the Related Art

Figure 1:
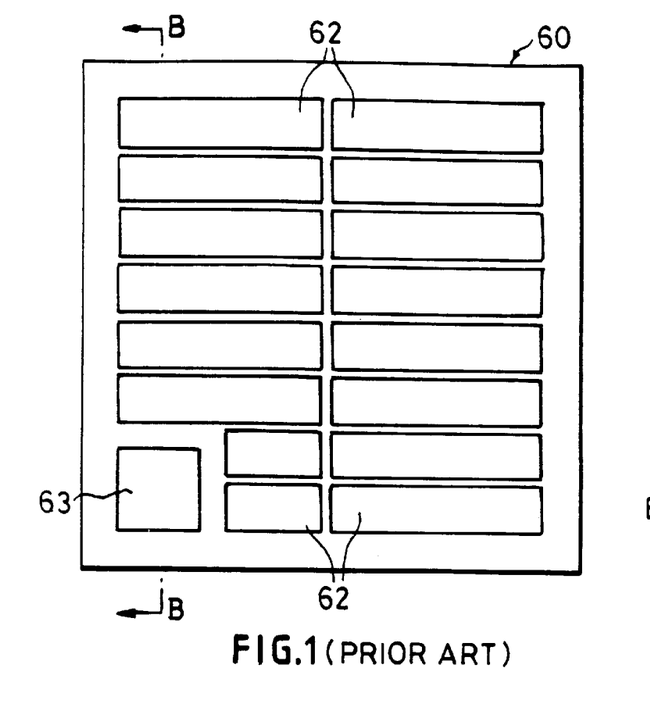
FIG. 1 is a schematic layout of a conventional pressure-contact type IGBT chip pattern.

FIG. 1 shows a schematic pattern layout on conventional pressure-contact type IGBT chips. The cross-sectional structure along the line B–B in FIG. 1 is schematically shown in FIG. 2, and an equivalent circuit of said pressure-contact type IGBT is shown in FIG. 3.

Figure 2:
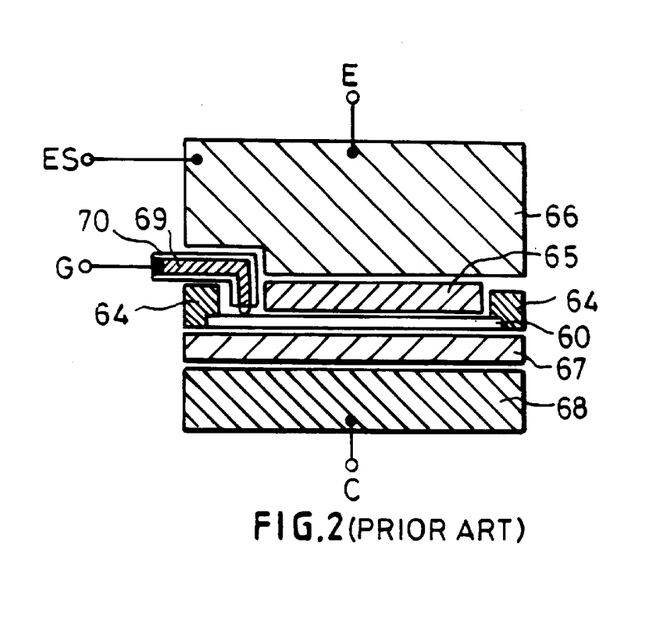
FIG. 2 is a cross-sectional view along the line B—B shown in FIG. 1.
Figure 3:
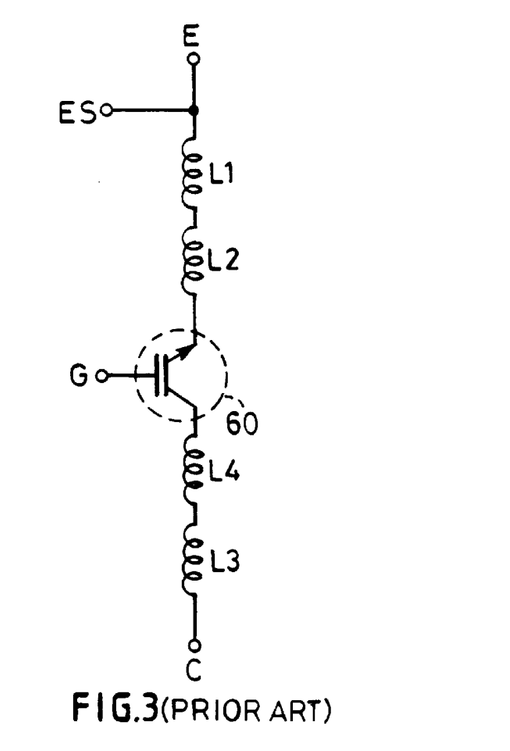
FIG. 3 is a diagram showing an equivalent circuit of the pressure-contact type IGBT shown in FIG. 1.

In FIG. 1 and FIG. 2, 60 shows an IGBT chip. On the top of this IGBT chip 60, there is formed an emitter electrode array 62 and a gate electrode 63 separately insulated from each other. 64 is a chip frame made of electrically insulate material to hold the outer edge of said IGBT chip 60; 65 is a first Mo (Molybdenum) plate so arranged that its one side is brought in contact with said emitter electrode array 62 of said IGBT chip 60; and 66 is a Cu emitter electrode plate so arranged that the other side is brought in compression contact with said first Mo plate 65.

67 is a second Mo plate so arranged that its one side is brought in contact with a collector electrode formed on the back of said IGBT chip 60, and 68 is a collector electrode plate so arranged that the other side is brought in compression contact with said second Mo plate 67.

69 is a gate electrode pull-out lead wire of which one end is brought in compression contact with a gate electrode 63 of said IGBT chip 60, the other end is taken out to the outside and its middle portion is covered by, for instance, an insulated tube 70 and is passing through a space enclosed by said chip frame 64 and emitter compression contact plates (the first Mo plate 65, the Cu emitter electrode plate 66).

Further, E is an emitter terminal connected to said Cu emitter electrode plate 66; C is a collector terminal connected to said collector electrode plate 68; and G is a gate terminal connected to said gate electrode lead wire 69.

In case of the pressure-contact type IGBT in said structure, an emitter compression contact plate composed of a single Mo plate 65 and a single Cu emitter electrode plate 66 is brought in compression contact with said emitter electrode array 62 on a single chip 60 and a collector compression contact plate composed of a single Mo plate 67 and a single collector electrode plate 68 is brought in compression contact a collector electrode on the back of the chip 60.

Therefore, like the equivalent circuit shown in FIG. 3, there exist inductance component L1 of the Cu emitter electrode plate 66 and inductance component L2 of the first Mo plate 65 in series between the emitter terminal E and the emitter electrode array 62 of the IGBT chip 60, and there exist inductance component L3 of the collector electrode plate 68 and inductance component L4 of the second Mo plate 67 in series between the collector terminal C and the collector electrode of the IGBT chip 10.

In a device using said pressure-contact type IGBT, an emitter voltage sensing terminal is needed to sense (monitor) voltage of an emitter electrode of the IGBT in order to detect overcurrent when applied to the IGBT. In a conventional compression contact structure, an emitter terminal ES is connected to the Cu emitter electrode plate 66.

However, as there exist inductance component L1 of the Cu emitter electrode plate and inductance component L2 of the first Mo plate in series between said emitter voltage sensing terminal ES and said emitter electrode array 62 as shown in FIG. 3, voltage is induced on said inductances L1 and L2 when emitter current changes.

In this case, if a time change of emitter current i like turn ON/OFF or current oscillation when the IGBT is in operation is expressed by di/dt, induced voltage V between both ends of said inductance components L1, L2 is expressed by the following expression:

$$V = -(L1+L2)di/dt$$

Here, if di/dt is large, a large induced noise is generated between the emitter terminal and the emitter electrode 62; an error is produced between a measured voltage value of the emitter terminal and a true emitter voltage value of the emitter electrode 62; and it becomes impossible to detect emitter voltage accurately. In this connection, in case of a device which operates at a high speed like an IGBT, di/dt is large and if it is operated at, for instance, 10000 A/us, induced noise as large as about 20 V is generated even when an inductance is as small as (L1+L2)=2nH.

As described above, in case of a conventional pressure-contact type semiconductor device in such a structure that an emitter compression contact plate is brought in compression contact with the emitter electrode array on a single semiconductor chip, there was such a problem that a large induced noise is generated if a time change of emitter current is large and it will become impossible to detect emitter voltage accurately as there exist inductance components of the emitter compression contact plate between the emitter terminal and the emitter electrode array.

SUMMARY OF THE INVENTION

The present invention is made to solve the problem described above and it is an object to provide a pressure-contact type semiconductor device that is capable of detecting emitter voltage accurately even when there exists inductance components of an emitter compression contacted plate between an emitter terminal and an emitter electrode array.

A pressure-contact type semiconductor device of the present invention includes a semiconductor chip having a gate electrode, an emitter electrode insulated and separated from the gate electrode but at the same potential, and an emitter sensing electrode on the top of the emitter electrode; an emitter compression contact plate in compression contact with the emitter electrode of said semiconductor chip; a collector compression contact plate in compression contact with a collector electrode on the back of said semiconductor chip; a gate electrode pull-out lead wire having one end in compression contact with a gate electrode of said semiconductor chip, the middle portion passing through the space electrically insulated from said emitter compression contact plate and the other end taken out to the outside; and an emitter sensing electrode pull-out lead wire having one end in compression contact with the emitter sensing electrode of said semiconductor chip, the middle portion passing through the space electrically insulated from said emitter compression contact plate, and the other end taken out to the outside.

According to a pressure-contact type semiconductor device of the present invention, it is possible to detect emitter voltage accurately even when there exists inductance components of an emitter compression contract plate between an emitter terminal and an emitter electrode.

BRIEF DESCRIPTION OF THE DRAWINGS

A more complete appreciation of the present invention and many of its attendant advantages will be readily obtained by reference to the following detailed description considered in connection with the accompanying drawings, in which.

DETAILED DESCRIPTION OF THE PREFERRED EMBODIMENTS

Embodiments of the prevent invention will be described in detail with reference to the drawings.

(EMBODIMENT 1)

Figure 4:
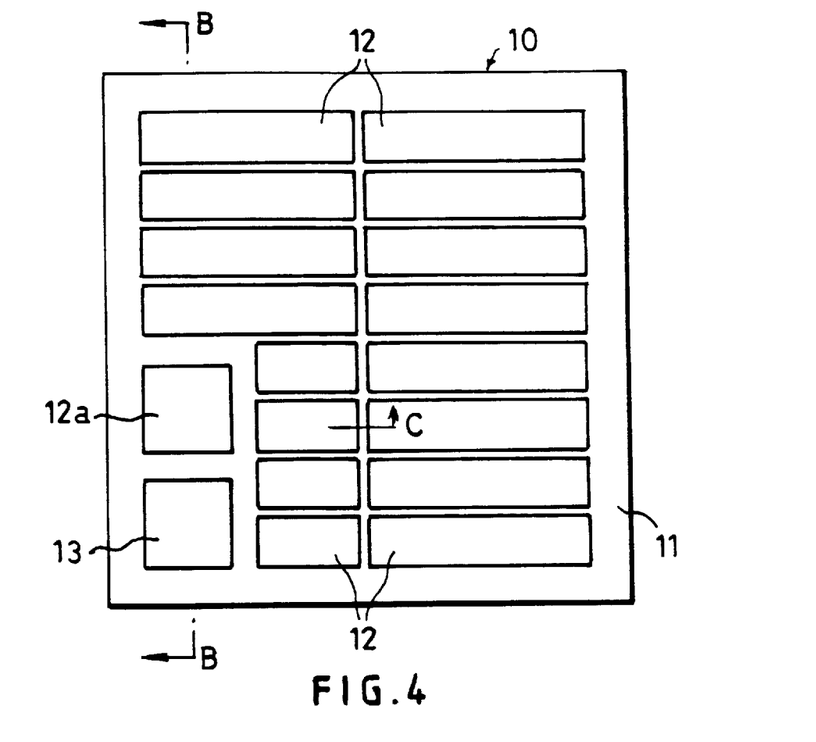
FIG. 4 is a schematic layout of a pressure-contact type IGBT chip pattern in accordance with a first embodiment of the present invention.
Figure 5:
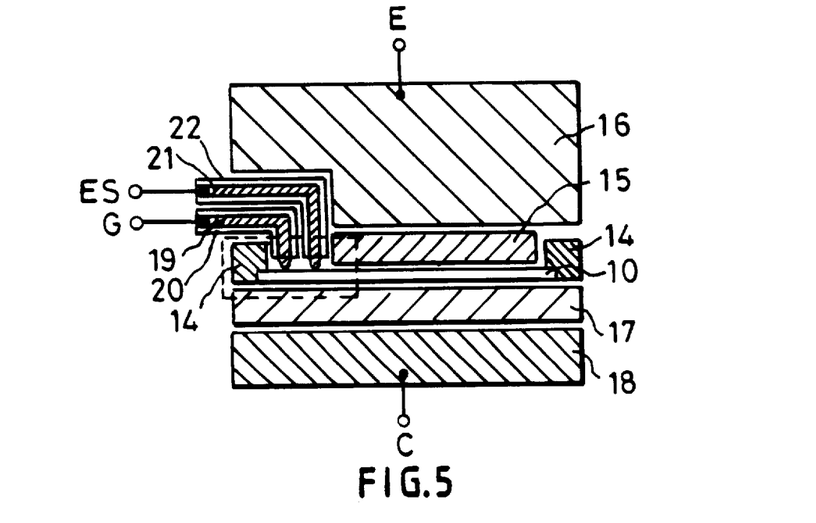
FIG. 5 is a cross-sectional view along the line B—B shown in FIG. 4.
Figure 6:
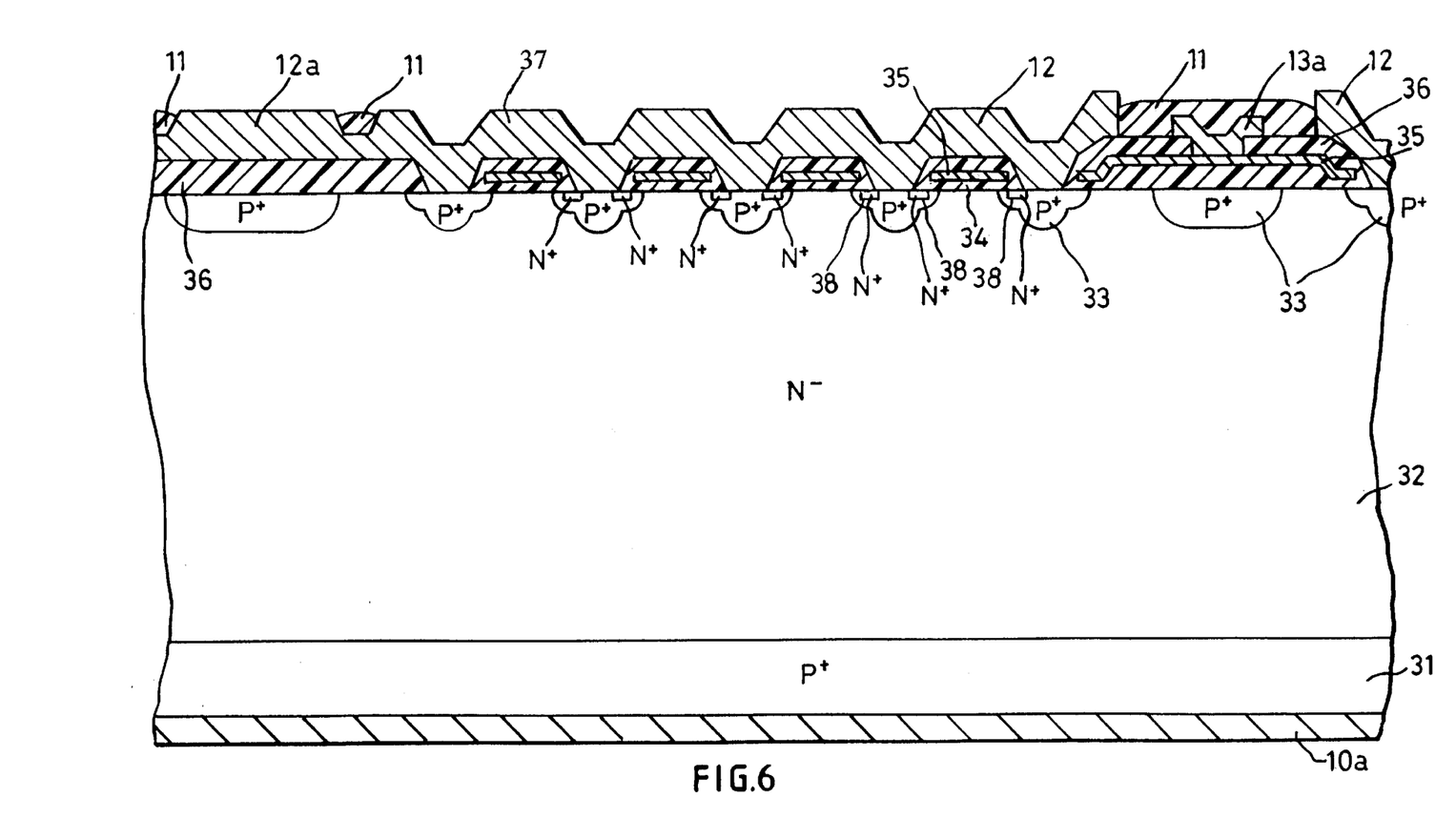
FIG. 6 is a cross-sectional view along the line C—C shown in FIG. 4.
Figure 8:
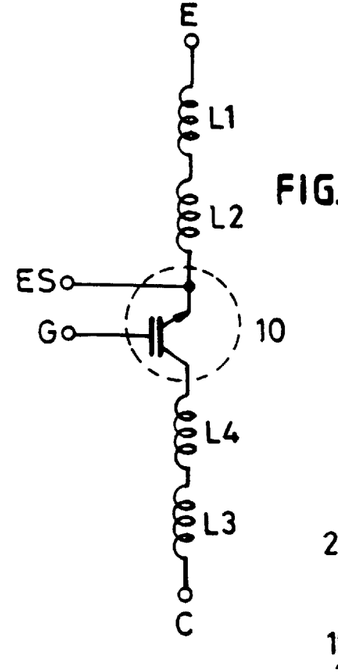
FIG. 8 is a diagram showing an equivalent circuit of the pressure-contact type IGBT shown in FIG. 4.

FIG. 4 is a schematic pattern layout on a pressure-contact type IGBT (Insulated Gate Bipolar Transistor) of withstand voltage about 1700 V–4500 V in accordance with a first embodiment of a pressure-contact type semiconductor device of the present invention. FIG. 5 shows the cross-sectional structure of this device schematically along the line B—B shown in FIG. 4. FIG. 6 shows the cross-sectional structure of the device including an emitter sensing electrode and an emitter electrode along the line C—C shown in FIG. 4. FIG. 8 shows an equivalent circuit of the pressure-contact type IGBT shown in FIG. 4.

In FIGS. 4, 5 and 6 an IGBT chip 10 has an emitter electrode 12, an emitter sensing electrode 12a and a gate electrode 13 formed on its top in the shape of an array. The width of one emitter electrode (in the vertical direction of the figures) is less than 1.5 mm. The reason for the arrangement of the emitter electrodes 12 in the shape of array is as follows. That is, the emitter electrode itself has internal resistance and this internal resistance is proportional to the area of the emitter electrode. So, if an emitter electrode is large, its internal resistance also becomes large proportionally and it will become difficult for the IGBT to carry out the high frequency operation. Both the emitter electrode 12 and the gate electrode 13 are insulated and separated by an insulation film 11. Further, the emitter sensing electrode 12a and the gate electrode 13 are also insulated and separated by the insulation film 11. The locations of the emitter sensing electrode 12a and the gate electrode 13 are not especially limited. However, the location of a gate electrode 13a shown in FIG. 6 lies between the emitter electrodes 12 in FIG. 4 and the emitter electrode 12 and the gate electrode 13a are arranged intermittently. The reason for this is that no difference is produced in a time of gate signal provided from gate electrode 13a to reach the gate electrode 13a above the emitter electrode 12. Further, it is desirable that they are formed at close locations to each other (for instance, adjacent locations) in a corner of a region wherein the emitter electrodes 12 are formed. The reason for this will be shown below. The first reason is that it is the optimum structure to pull out the emitter electrode and the emitter sensing electrode to the outside in a pressure-contact type structure because the emitter electrode 12 and the emitter sensing electrode 12a are pulled out to the outside by lead wires. The second reason is that as the IGBT is of voltage driving type, phases of gate potential and emitter potential will become the same and the gate electrode and the emitter electrode come close to each other and oscillation of their phases is canceled.

Next, as shown in FIG. 5, a framework 14 is made of electrically insulated material to hold the outer edge of said IGBT chip 10. A first Mo (molybdenum) plate 15 for heat buffering is arranged so that one side of the emitter electrode 12 of said IGBT chip 10 is brought in compression contact with it. A Cu (Copper) emitter plate 16 is arranged so that its other side is brought in compression contact with said first Mo plate 15. That is, an emitter compression contact plate composed of a single first Mo plate 15 and a single Cu emitter electrode plate 16 is kept in compression contact with the emitter electrode on a single IGBT chip 10

A second Mo plate 17 for heat buffering is arranged so that its one side is in compression contact with a collector electrode formed on the back of said IGBT chip 10. A collector electrode plate 18 is arranged so that its other side is in compression contact with the second Mo plate 17. That is, a collector compression contact plate composed of a single second Mo plate 17 and a single collector electrode plate 18 is kept in compression contact with a collector electrode formed on the back of the IGBT chip 10.

A gate electrode pull-out lead wire 19 has one end in compression contact with the gate electrode 13 of said IGBT chip 10, the other end taken out to the outside, and the middle portion covered by, for instance, an insulation tube 20 and passing through a so-called first space enclosed by said framework 14 and said emitter compression contact plate (the first Mo plate 15, the Cu emitter electrode plate 16).

Further, an emitter sensing electrode lead wire 21 has one end in compression contact with the emitter sensing electrode 12a of said IGBT chip 10 and the other end taken out to the outside. Its middle portion is covered by, for instance, an insulating tube 22 and passes through the space enclosed by said framework 14 and said emitter compression contact plate (the first Mo plate 15, the Cu emitter electrode plate 16).

Further, in FIG. 5, an emitter terminal E is connected to said Cu emitter electrode plate 16. A collector terminal C is connected to said collector electrode plate 18. A gate terminal G is connected to said gate electrode pull-out lead wire 19. An emitter voltage sensing terminal ES is connected to said emitter sensing electrode pull-out lead wire 21.

Figure 7:
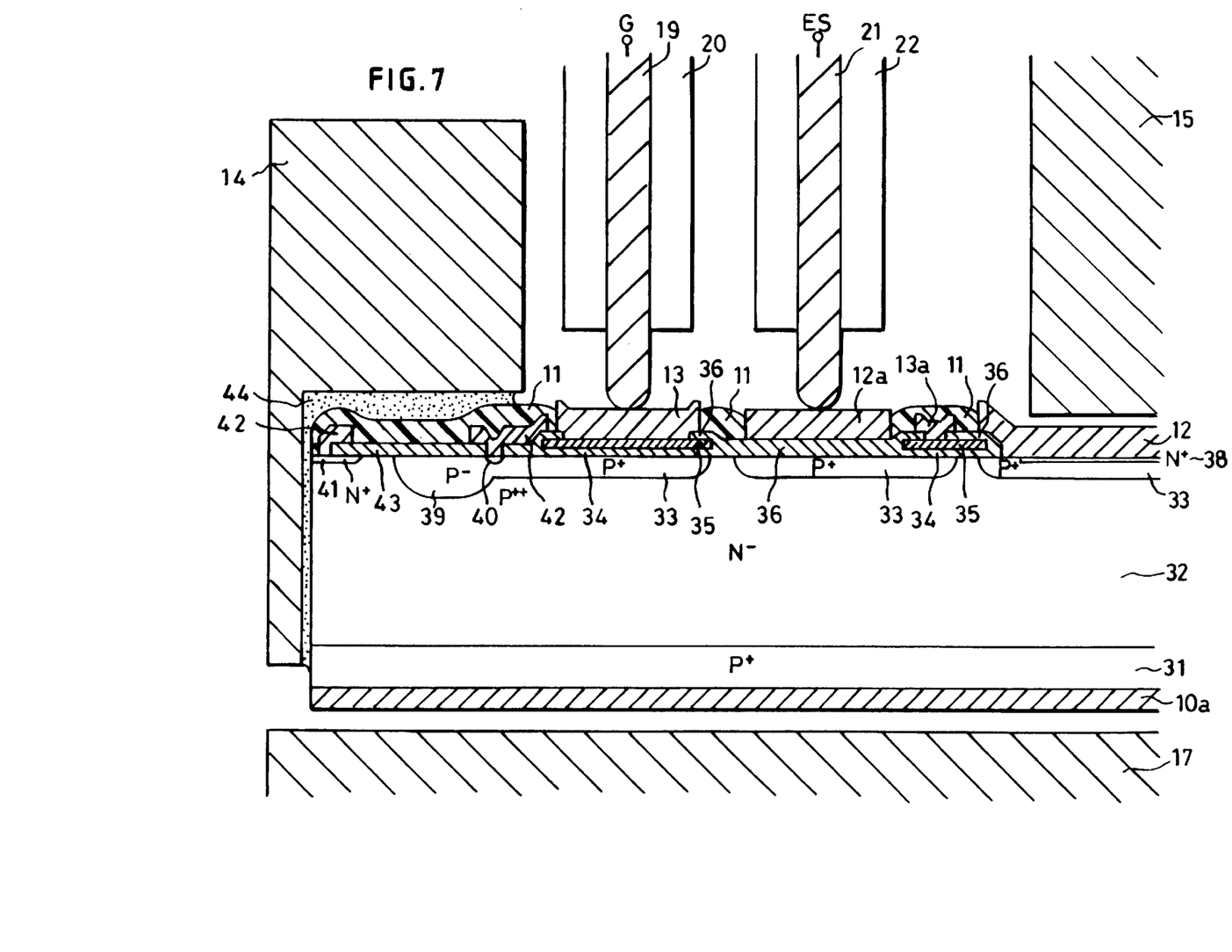
FIG. 7 is an enlarged diagram of the dotted portion shown in FIG. 5.

FIG. 7 is an enlarged diagram of the dotted portion shown in FIG. 5. The second Mo plate 17 is electrically connected to a collector layer 31 via a collector electrode 10a and transmits and radiates heat generated in the IGBT chip 10. An NPN transistor is composed of an N⁻ layer 32, a base region 33 and emitter region 38, while a PNP transistor is composed of a collector layer 31, an N⁻layer 32 and a base region 33. A thyristor structure is formed by connecting these NPN and PNP transistors in reverse parallel. A plurality of the base regions 33 are formed on the top of the N⁻layer 32. The emitter regions 37, 38 are formed on the surface of this base region 33. These emitter region 38 and the N⁻layer 32 construct a source region and a drain region. A gate electrode 35 is formed to extend over these emitter region 38 and the N⁻layer 32 via a gate insulation film 34. When voltage is applied to this gate electrode 35 and the induction portion between the emitter region 38 and the N⁻layer 32 of the surface of the base region 33 is reversed (that is, the channel region is reversed), an MOS transistor is turned ON and the thyristor structure composed of the NPN and PNP transistors connected in reverse parallel is turned ON.

The gate electrode 35 is pulled out to the outside by a gate electrode pad 13. This gate electrode pad 13 is connected to the gate electrode pull-out lead wire 19 and a gate voltage signal is applied to the gate electrode 35 from the outside via this gate electrode pull-out lead wire 19.

The emitter region 38 is connected to the emitter electrode 12 formed on the surface of the base region 33. The emitter electrode 37, although not illustrated, is electrically connected to the emitter region 38 and the emitter sensing electrode 12a. This emitter sensing electrode 12a is pulled out to the outside by the emitter sensing electrode pull-out lead wire 21 and monitors emitter voltage.

FIG. 6 is a cross-sectional view along the line C—C in FIG. 4. The emitter sensing electrode 12a and the emitter electrode 12 are formed on the same layer of a semiconductor substrate which becomes the basic body of the IGBT chip 10 so that they retain the same potential. Further, the emitter electrode 12 is formed in the mesa shape at its upper part and the first Mo plate 15 is brought in compression contact with this part and thus, the first Mo plate 15 and the emitter electrode 12 are electrically connected to each other. Heat generated in the IGBT chip 10 is conducted from the emitter electrode 12 to the first Mo plate 15 and radiated therefrom via the Cu emitter electrode plate.

The IGBT chip shown in FIG. 6 has a number of IGBT devices which jointly connect to the collector electrode 10a and the emitter sensing electrode 12a connected to the emitter electrode 12. The base region 33 is formed at the lower part of the emitter sensing electrode 12a. The emitter region 38 is not formed, and the emitter sensing electrode 12a is not in contact with the emitter region 38.

In FIG. 6, 31 is an N⁻type semiconductor layer (the collector layer) and 32 is an P+ type semiconductor layer on the P⁻type semiconductor layer. 33 is a P+ type semiconductor layer (the base region) partially formed on the surface of the N⁻ type semiconductor layer 32. The width of this P+ type semiconductor layer 33 is about 3 um and the space between the base regions is about 3–4 um. A gate insulation film 34 (oxidized film) is formed on a part of the surface of the N⁻ type semiconductor layer 32. The thickness of this gate insulation film 34 is about 100 nm. A gate electrode 35 is formed on the gate insulation film 34 in thickness of about 500 nm. 36 is a layer insulation film formed by silicon oxide. An electrode 37 for emitter is formed on the layer insulation film 36 using, for instance, an aluminum film. This electrode 37 for emitter is about 4 um thick. An insulation film 11 is protecting the gate electrode 13, and separating the emitter electrode 12 from emitter sensing electrode 12a.

Most of said electrodes 37 for emitters are used as the emitter electrode 12 but some of them are used as the emitter sensing electrode 12a. In this case, the emitter region 38 is partially formed on the surface of the P+ type semiconductor layer 33 positioned at the lower part of the emitter electrode 12 and the emitter electrode 12 is in contact with this emitter region 38 through a contact hole opened on the layer insulation film 36. On the contrary, the emitter region 38 is not formed on the P+ type semiconductor layer 33 positioned at the lower part of the emitter sensing electrode 12a.

That is, the pressure-contact type IGBT in said structure is equipped with a semiconductor chip 10 provided with a group of the emitter electrodes 12, the emitter sensing electrodes 12a and the gate electrodes 13 formed on the top and divided into the plural numbers by the insulation films 11 and the collector electrodes 10a formed on the back, the chip frame 14 made of electrically insulated material to hold the outer edge of said semiconductor chip; the first heat buffering plate 15 so arranged that one side is brought in pressure contact with the emitter electrode of said semiconductor chip, the emitter electrode plate 16 so arranged that the other side is brought in pressure contact with said first heat buffering plate; the second heat buffering plate 17 so arranged that one side is brought in compression contact with the collector electrode on the back of said semiconductor chip; the collector electrode plate 18 so arranged that the other side is brought in compression contact said second heat buffering plate, the gate electrode pull-out lead wire 19 of which one end is brought in compression contact with the gate electrode of said semiconductor chip, its middle portion will pass through the space which is electrically insulated from said first heat buffering plate and said emitter electrode plate, and the other end is taken out to the outside; the emitter sensing electrode pull-out lead wire 21 of which one end is brought in compression contact with the emitter sensing electrode 12a of said semiconductor chip, the middle portion will pass through the space electrically insulated from said first heat buffering plate and said emitter electrode plate, and the other end is taken out to the outside; the emitter terminal E connected to said emitter electrode plate 16; the collector terminal C connected to said collector electrode plate 18; the gate terminal G connected to said gate electrode pull-out lead wire 19; and the emitter voltage sensing terminal ES connected to said emitter electrode pull-out lead wire 21.

In case of a pressure-contact type IGBT in said structure, as in the equivalent circuit shown in FIG. 8, there exist inductance component L1 of the Cu emitter electrode plate 16 and inductance component L2 of the first Mo plate 15 in series between the emitter terminal E and the emitter electrode 12 of the IGBT chip 10, and there exist inductance component L3 of the collector electrode plate 18 and inductance component L4 of the second Mo plate 17 in series between the collector terminal C and the collector electrode of the IGBT chip 10.

According to said pressure-contact type IGBT, when sensing (monitoring) voltage of the emitter electrode 12 of the IGBT in order to detect an overcurrent and the like of the IGBT in a system using the IGBT, it is possible to directly measure voltage of the emitter sensing electrode 12a via the emitter voltage sensing terminal ES without using the emitter compression contact plate (the first heat buffering plate 15, the emitter electrode plate 16) and the emitter terminal E as in a conventional example.

Accordingly, even if a large induced noise is generated by induced voltage of inductance components (L1+L2) existing in the emitter compression contact plate between the emitter terminal E and the emitter electrode 12 when the time change of the emitter current is large, it becomes possible to detect emitter voltage accurately

(EMBODIMENT 2)

Figure 9:
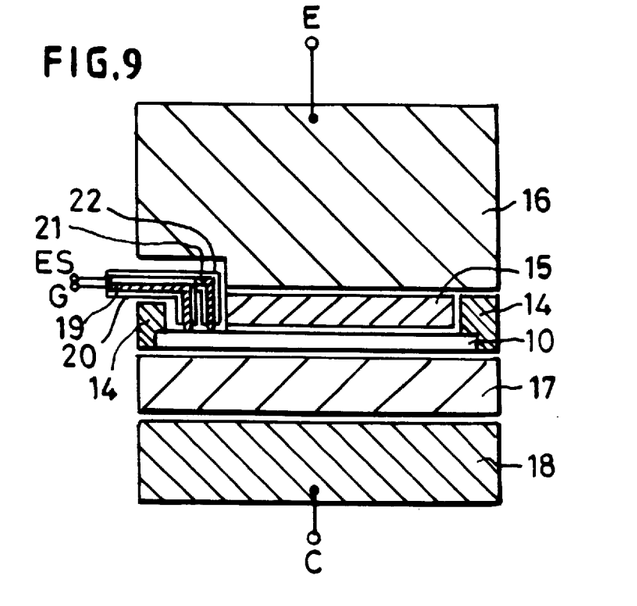
FIG. 9 is a cross-sectional view of the IGBT chip in accordance with a second embodiment of the present invention.

FIG. 9 is a diagram corresponding to FIG. 5 in a second embodiment. In FIG. 5, the gate electrode pull-out lead wire 19 and the emitter sensing electrode pull-out lead wire 21 are arranged close to each other in the vertical direction. In FIG. 9, the gate electrode pull-out lead wire 19 and the emitter sensing electrode pull-out lead wire 21 are arranged close to each other in the horizontal direction.

(EMBODIMENT 3)

Figure 10:
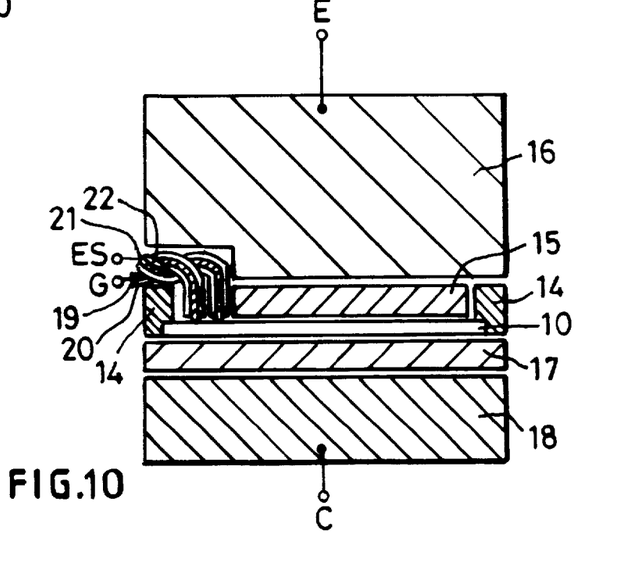
FIG. 10 is a cross-sectional view of the IGBT chip in accordance with a third embodiment of the present invention.

FIG. 10 is a diagram corresponding to FIG. 5 in a third embodiment. In FIG. 5, the gate electrode pull-out lead wire 19 and the emitter sensing electrode pull-out lead wire 21 are arranged close to each other in the vertical direction. In FIG. 10, the gate electrode pull-out lead wire 19 and the emitter sensing electrode pull-out lead wire 21 are pulled out to the outside in a twisted state.

If two lead wires are pulled out in the twisted state in this manner, when noise comes in from the outside, the noise passes through the gate electrode pull-out lead wire 19 and the emitter sensing electrode pull-out lead wire 21 at the same time but the noise passing through these lead wires are offset each other because the lead wires are twisted. Thus, the effect of the noises to the emitter potential becomes less.

(EMBODIMENT 4)

The embodiments so far presented are those for a single IGBT chip. In the fourth embodiment the concept in the embodiments so far presented is applied to a plurality of IGBT chips.

Figure 11:
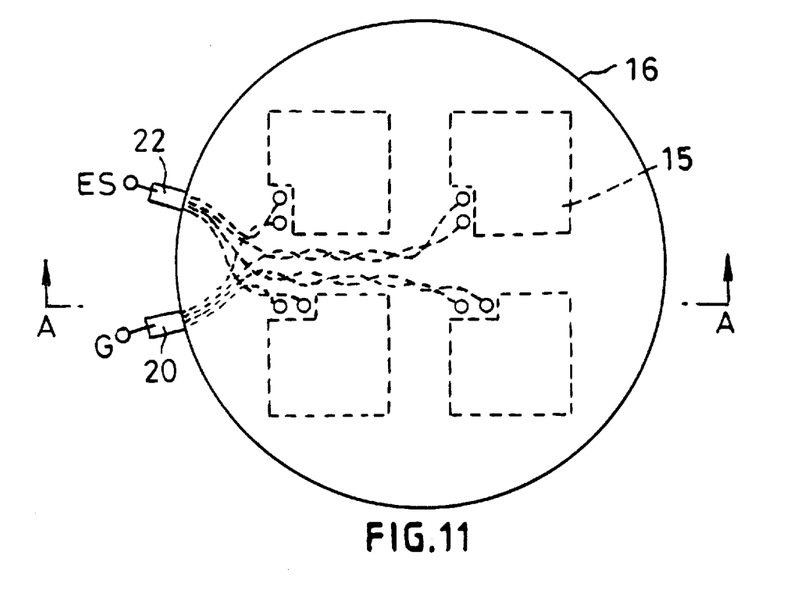
FIG. 11 is a top view of an IGBT module in accordance with a fourth embodiment of the present invention.
Figure 12:
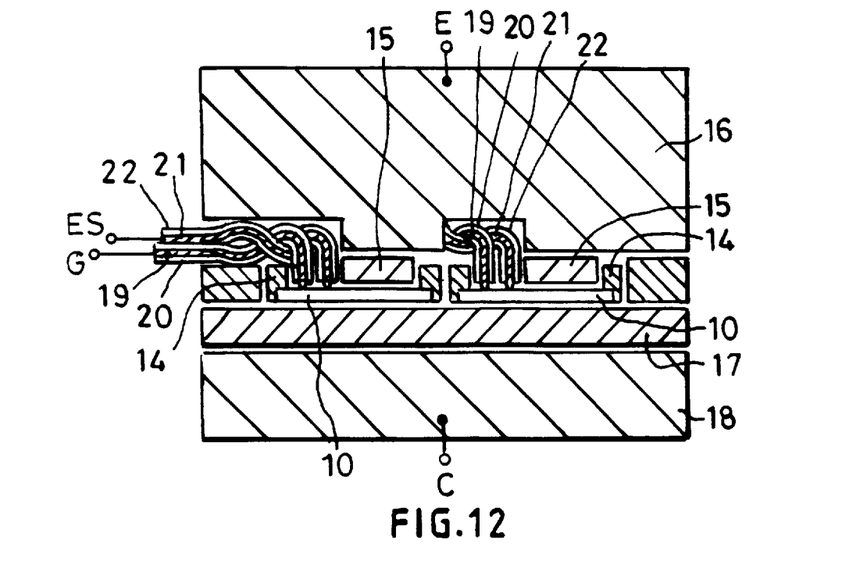
FIG. 12 is a cross-sectional view along the line A—A shown in FIG. 11.

FIG. 11 is a plan view showing the state of the first Mo plate 15 and the Cu emitter electrode plate 16 compression contacted to a plurality of IGBT chips 10 arranged in a quadrilateral shape as viewed from above. FIG. 12 is a cross-sectional view along the line A—A in FIG. 11.

On the surface of the IGBT chip 10, there are formed a gate electrode, an emitter electrode which has the same potential as that of the gate electrode, and an emitter sensing electrode. A collector electrode is formed on the back. At the outer edge of the IGBT chip 10, the chip frame 15 made of electrically insulated material is arranged to hold the IGBT chip 10. On each top of a plurality of IGBT chips 10, the first Mo plate 15 is arranged, and these first Mo plates 15 are compression contacted to respective IGBT chips 10 by a single Cu emitter electrode plate 16.

The gate electrode pull-out lead wire 19 and the emitter sensing electrode pull-out lead wire 21, which are electrically connected to the gate electrode and the emitter sensing electrode provided on each surface of respective IGBT chips 10, are twisted and arranged so as to pass through the space that is electrically insulated from the first Mo plate 15 and the Cu emitter electrode plate 16. A plurality of these gate electrode pull-out lead wires 19 and emitter sensing electrode pull-out lead wires 21 are collected together for the gate electrode pull-out lead wires and the emitter sensing electrode pull-out lead wires near respective terminals and pulled out to the outside.

While there has been illustrated and described what are presently considered to be preferred embodiments of the present invention, it will be understood by those skilled in the art that various changes and modifications may be made, and equivalents may be substituted for devices thereof without departing from the true scope of the invention. In addition many modifications may be made to adapt a particular situation or material to the teaching of the present invention without departing from the central scope thereof. Therefore, it is intended that this invention not be limited to the particular embodiment disclosed as the best mode contemplated for carrying out this invention, but that the invention includes all embodiments falling within the scope of the appended claims.

What is claimed is:

1. A pressure-contact type semiconductor device, comprising:
    a semiconductor chip;
    a gate electrode on a first surface of the semiconductor chip;
    an emitter electrode insulated and separated from the gate electrode;
    an emitter sensing electrode on the first surface of the semiconductor chip and at the same potential as the emitter electrode; and
    a collector electrode on a second surface of the semiconductor chip;
    wherein emitter voltage is measured directly from said emitter sensing electrode.

2. The pressure-contact type semiconductor device according to claim 1, wherein the semiconductor chip is an insulated gate bipolar transistor.

3. The pressure-contact type semiconductor device according to claim 1, comprising a plurality of the semiconductor chips and wherein emitter sensing electrodes of the plurality of semiconductor chips are connected in parallel for measuring emitter voltage.

4. A pressure-contact type semiconductor device, comprising:
    a semiconductor chip;
    a gate electrode on a first surface of the semiconductor chip;
    an emitter electrode insulated and separated from the gate electrode;
    an emitter sensing electrode on the first surface of the semiconductor chip and at the same potential as the emitter electrode, and a collector electrode on a second surface of the semiconductor chip;
    an emitter compression contact plate in compression contact with the emitter electrode;
    a collector compression contact plate in compression contact with the collector electrode;
    a gate electrode pull-out lead wire having one end in compression contact with the gate electrode and another end connected to an external gate terminal; and
    an emitter sensing electrode pull-out lead wire having one end in compression contact with the emitter sensing electrode and another end connected to an external emitter sensing terminal.

5. The pressure-contact type semiconductor device according to claim 4, wherein said emitter electrode and said emitter sensing electrode are made of the same conductive film.

6. The pressure-contact type semiconductor device according to claim 4, wherein said gate electrode and said emitter sensing electrode are formed close to each other.

7. The pressure-contact type semiconductor device according to claim 4, wherein said gate electrode pull-out lead wire and said emitter sensing electrode pull-out lead wire are pulled out in a twisted state.

8. The pressure-contact type semiconductor device according to claim 4, wherein a plurality of said semiconductor chips are provided.

9. The pressure-contact type semiconductor device according to claim 8, wherein gate electrode pull-out lead wires and said emitter sensing electrode pull-out lead wires of said plurality of said semiconductor chips are pulled out in a twisted state.

10. The pressure-contact type semiconductor device according to claim 4, said semiconductor chip comprising:
   a first semiconductor layer of a first conductive type having low impurity density, in the first surface of said semiconductor chip;
   a second semiconductor layer of a second conductive type having a high impurity density, comprising the back and the collector region of said semiconductor chip;
   a plurality of base regions in a surface of said first semiconductor layer and having the second conductive type;
   an emitter region in a surface of said base region;
   a layer insulation film on said first semiconductor layer;
   a gate electrode pad on an exposed surface of said gate electrode and electrically connected to said gate electrode;
   an emitter sensing electrode pad on said layer insulation film and electrically connected to said emitter region;
   an emitter electrode pad on said first semiconductor layer and electrically connected to said emitter region.

11. The pressure-contact type semiconductor device according to claim 10, wherein said gate electrode pull-out lead wire is in compression contact with said gate electrode via said gate electrode pad and said emitter sensing electrode pull-out lead wire is in compression contact with said emitter sensing electrode via said emitter sensing electrode pad.

12. A pressure-contact type semiconductor device, comprising:
   a semiconductor chip;
   a gate electrode on a first surface of the semiconductor chip;
   an emitter electrode insulated and separated from the gate electrode;
   an emitter sensing electrode on the first surface of the semiconductor chip and at the same potential as the emitter electrode;
   a collector electrode on a second surface of the semiconductor chip;
   a framework holding the outer edge of the semiconductor chip;
   a first heat buffering plate having one side in compression contact with the emitter electrode;
   an emitter electrode plate in compression contact with another surface of the first heat buffering plate;
   a second heat buffering plate having one side in compression contact with the collector electrode;
   a collector electrode plate in compression contact with another surface of the second heat buffering plate;
   a gate electrode pull-out lead wire having one end in compression contact with the gate electrode and another end connected to an external gate terminal;
   an emitter sensing electrode pull-out lead wire having one end in compression contact with the emitter sensing electrode and another end connected to an external emitter sensing terminal;
   an emitter terminal coupled to said emitter electrode plate; and
   a collector terminal coupled to said collector electrode plate.

13. The pressure-contact type semiconductor device according to claim 12, said semiconductor chip comprising:
   a first semiconductor layer of first conductive type having a low impurity density, in the first surface of said semiconductor chip;
   a second semiconductor layer of a second conductive type having a high impurity density, in the second surface of said semiconductor chip;
   a plurality of base regions in a surface of said first semiconductor layer, and having the second conductive type;
   an emitter region in a surface of said base region;
   a layer insulation film on said first semiconductor layer;
   a gate electrode pad on an exposed surface of the gate electrode and electrically connected to said gate electrode;
   an emitter sensing electrode pad on said layer insulation film and is electrically connected to said emitter region;
   an emitter electrode pad on the surface of said first semiconductor layer and is electrically connected to said emitter region.

14. The pressure-contact type semiconductor device according to claim 13, wherein a plurality of said semiconductor chips are provided.

15. The pressure-contact type semiconductor device according to claim 14, wherein said gate electrode pull-out lead wires and emitter sensing electrode pull-out lead wires of said plurality of semiconductor chips are pulled out in a twisted state.

16. A pressure-contact type semiconductor device, comprising:
   a plurality of semiconductor chips;
   a gate electrode on a first surface of each of the semiconductor chips;
   an emitter electrode insulated and separated from each of said gate electrodes;
   an emitter sensing electrode on the first surface of each semiconductor chip and at the same potential as each emitter electrode;
   a collector electrode on a second surface of each semiconductor chip;
   a plurality of frameworks holding the outer edges of said semiconductor chips;
   a plurality of first heat buffering plates each having a surface in compression contact with one of said emitter electrodes;
   an emitter electrode plate in compression contact with another surface of each of said first heat buffering plates;
   a plurality of second heat buffering plates each having one side in compression contact with one of said collector electrodes;
   a collector electrode plate in compression contact with another surface of each of said second heat buffering plates;

a plurality of gate electrode pull-out lead wires each having one end in compression contact with one of said gate electrodes and another end connected to an external gate terminal; and a plurality of emitter sensing electrode pull-out lead wires each having one end in compression contact with one of said emitter sensing electrodes and another end connected to an external emitter sensing terminal, wherein a plurality of said gate electrode pull-out lead wires and a plurality of said emitter sensing electrode pull-out lead wires are twisted together, a plurality of said gate electrode pull-out lead wires are connected to said gate terminal, and a plurality of said emitter sensing electrode pull-out lead wires are connected to said emitter sensing terminal.

* * * * *